(12) United States Patent
Bartholomeusz et al.

(10) Patent No.: US 6,521,062 B1
(45) Date of Patent: Feb. 18, 2003

(54) WROUGHT PROCESSING OF BRITTLE TARGET ALLOY FOR SPUTTERING APPLICATIONS

(75) Inventors: Michael Bartholomeusz, Phoenix, AZ (US); Michael Tsai, Phoenix, AZ (US); Anand Deodutt, Gilbert, AZ (US)

(73) Assignee: Heraeus, Inc., Chandler, AZ (US)

( * ) Notice: Subject to any disclaimer, the term of this patent is extended or adjusted under 35 U.S.C. 154(b) by 0 days.

(21) Appl. No.: 09/690,889

(22) Filed: Oct. 18, 2000

Related U.S. Application Data

(62) Division of application No. 09/410,014, filed on Oct. 1, 1999.

(51) Int. Cl.[7] ................................................. C22F 1/10
(52) U.S. Cl. ................... 148/674; 148/120; 204/298.13
(58) Field of Search ............................... 148/674, 120; 204/298.13

(56) References Cited

U.S. PATENT DOCUMENTS

| | | | |
|---|---|---|---|
| 2,855,295 A | 10/1958 | Hansel | |
| 3,085,005 A | 4/1963 | Michael et al. | |
| 3,620,852 A | 11/1971 | Herchenroeder | |
| 3,649,256 A | 3/1972 | Fletcher | |
| 4,144,059 A | 3/1979 | Liu et al. | |
| 5,282,946 A | * 2/1994 | Kinoshita et al. | 148/674 |
| 5,334,267 A | * 8/1994 | Taniguchi et al. | 148/425 |
| 5,468,305 A | 11/1995 | Uchida et al. | |
| 5,728,279 A | * 3/1998 | Schlott et al. | 148/313 |

FOREIGN PATENT DOCUMENTS

| | | |
|---|---|---|
| JP | 04-263069 | 9/1992 |

OTHER PUBLICATIONS

Encyclopedia of Chemical Technology, 3rd Ed., vol. 15, John Wiley & Sons, New York, pp. 325–345 No date.

* cited by examiner

*Primary Examiner*—Roy King
*Assistant Examiner*—Andrew E Wessman
(74) *Attorney, Agent, or Firm*—McDermott, Will & Emery

(57) ABSTRACT

An ingot of material which is normally too brittle to allow successful rolling and wrought processing is formed so as to have a thickness-to-width ratio of less than about 0.5 and is annealed in a temperature range of 1000° F. to 2500° F. for a preselected time. The ingot is then rolled in a temperature range of 1500° F. to 2500° F. Additional/optional annealing of the resulting rolled plate in a temperature range of 500° F. to 2000° F., or between room temperature and 1500° F., and/or a final annealing between 500° F. and 1500° F., is possible. Sputtering targets are cut out of the rolled plate and used for the manufacture of storage disks.

20 Claims, 10 Drawing Sheets

Center　　　　Surface

WROUGHT PROCESSING OF BRITTLE TARGET ALLOY FOR SPUTTERING APPLICATIONS

This application is a Divisional of application Ser. No. 09/410,014 filed Oct. 1, 1999.

FIELD OF THE INVENTION

This invention relates generally to multi-component cobalt alloy material which is used for sputter deposition of a magnetic layer on a data/storage disk, and more specifically to a method of producing an alloy material, such as that based on a brittle Co-based alloy, which exhibits microstructural and magnetic properties that are optimized for magnetron sputtering, and which finds application in the formation of a sputtering target.

DESCRIPTION OF THE RELATED ART

The manufacture of storage disks and read/write heads involves the use of target materials that are used to sputter deposit a thin film media onto a suitable substrate. Cobalt-based alloy targets are frequently used for this purpose.

However, multi-component Co alloys with primary elemental additions such-as Cr, Pt, Ni (0 to 30 atomic%) and secondary elemental additions such as Ta, B, Nb, Sm, Fe, Si, Zr, W, Mo, V, Hf, and Ti (0 to 30 atomic%) can be very difficult or impossible to conventionally roll-process if the concentration of limited solid-solubility elements is excessive. Since vacuum induction melting is necessary to ensure a high purity product, the only practical way to manufacture these brittle alloys has been to make as-cast targets. However, as cast targets have several unfavorable microstructural characteristics such as large grain-size, gross segregation of matrix and precipitate phases, through thickness microstructural and chemical gradients and porosity.

It is fairly typical that a pair of magnetic alloy targets can be used to fabricate in excess of 20,000 individual data-storage disks. Since the magnetic target alloy is continually loosing surface atomic layers during the sputtering process, through thickness and in-plane target microstructural homogeneity is essential to ensure film property homogeneity on the many thousands of disks fabricated from each target and the many thousand more fabricated from the numerous targets constituting a production lot or originating from several individual production lots. A production lot represents all the targets that are exposed to exactly the same thermomechanical history (i.e. originating from one melted ingot).

Precipitate segregation in the matrix of Co-based magnetic target alloys has been shown to impact deposited film magnetic properties such as Coercivity and Overwrite. When tens of thousands of data storage devices are being made from several targets, it is necessary that the Coercivity response be consistent on all the disks, i.e., quality control, and not be a function of the specific target utilized. Therefore, there is a substantial need in the art for Co-based magnetic targets which exhibit consistent performance, both within a target and from target to target.

Prior work serves to illustrate the effect of target precipitate and grain uniformity on the sputter deposited film: Two targets of a Co—Cr—Ta alloy were fabricated. Target A was fabricated using standard techniques and possessed a coarse and non-uniform Ta precipitate-phase microstructural morphology. Target B was fabricated to yield a homogeneous microstructure consisting of a uniform dispersion of the precipitate phase. Sputter process trials were in which the two targets, A and B, were placed on either side of the sputtering chamber so that they would be used for material deposition on the opposite sides of the same disk. These precautions were taken to ensure that exactly the same sputter conditions and testing conditions applied for films deposited using the two differently fabricated targets. Furthermore, targets A and B were interchanged in the sputtering chamber to ensure that no anomalies associated with location in the chamber were obscuring the results of the investigation. The results of the analysis revealed that the magnetic films on disks fabricated using target A exhibited coercivities that ranged from 1580 Oersteds to 1780 Oersteds. In contrast, the films on disks sputter deposited with magnetic material using target B exhibited Coercivities that ranged between 1920 to 2000 Oersteds. The film Coercivity was ascertained using conventional VSM testing techniques, widely employed in the disk manufacturing industry. There are several noteworthy points resulting from this analysis. First, target A, possessing a inhomogeneous microstructure, resulted in films with a significantly lower Coercivity response than films deposited using target B which possessed a homogeneous microstructure. Second, the actual film Coercivities obtained from target A (overall range=200 Oersteds) were,much less consistent than the film Coercivities obtained from target B (overall range=80 Oersteds). These results demonstrate that if target precipitate and grain uniformity are not controlled, the resulting Coercivity response of the sputtered film can be diminished and the disk-to-disk Coercivity consistency can be adversely effected.

Prior art which has been concerned with this or similar problems include the following United States Patents:

| U.S. Pat. No. | Inventor | Date of Patent |
| --- | --- | --- |
| 2,855,295 | Hansel | 1958 |
| 3,085,005 | Michael, et al. | 1963 |
| 3,620,852 | Herchenroeder et al. | 1971 |
| 3,649,256 | Fletcher | 1972 |
| 4,144,059 | Liu et al. | 1979 |
| 5,282,946 | Kinoshita et al. | 1994 |
| 5,334,267 | Taniguchi et al. | 1994 |
| 5,468,305 | Uchida et al. | 1995 |
| 5,728,279 | Schlott et al. | 1998 |

Accordingly, there is a need in at least the data storage industry, for a technique by which targets made of Co-based alloys or the like, which conventionally tend to exhibit brittleness to the degree that wrought processing can not be used, can be manufactured with the required microstructurally homogeneous, fully dense and low permeability characteristics necessary to enable the production of high quality storage disks. The present invention meets this need.

SUMMARY OF THE INVENTION

An object of the present invention is therefore to provide a method of forming a piece of material suitable for making a magnetron sputtering target, that is capable of being rolled and wrought processed in a manner which improves the physical and magnetic characteristics such as grain size, crystallographic texture, chemical/microstructural uniformity and permeability.

A further object of the present invention is to enable the formation of a sputtering target which is constituted in such a manner as to cause the magnetic layers which are sputter deposited onto the surface of a data/storage disk, to exhibit improved physical/magnetic characteristics.

During efforts to overcome the above mentioned problem and to develop a microstructurally homogeneous, fully dense and low permeability target, it was unexpectedly discovered that by subjecting cast ingots to an annealing step at temperatures between about 1500° F. and 2500° F., with or without the presence of an applied hydrostatic or compressive pressure, which can aid in stress assisted diffusional healing of porosity, particularly good microstructures were obtained.

The annealing could be typically carried out for 0.5–168 hours. When pressure was applied, the pressures of 2 to 60 ksi were typically used. It was noted that the dimensions of an ingot treated in the above manner, had an effect on the final product and that a thickness-to-width ratio less than about 0.5 was favorable to facilitate a successful conclusion to the rolling and wrought processing.

In brief, the above objects are thus achieved by forming an ingot of material which is normally too brittle to allow successful rolling and wrought processing so as to have a thickness-to-width ratio less than about 0.5, and annealing this ingot in a controlled temperature environment of 1500° F. to 2500° F., and then rolling the annealed member at an initial temperature range between 2500° F. and 1000° F., reheating the ingot if the plate temperature falls below 500° F.

DESCRIPTION OF THE PREFERRED EMBODIMENTS

Our research into Co—Cr—Pt—B—Ta alloys revealed an inhomogeneity associated with as-cast microstructures in alloys wherein the solid solubility of Ta and B in the Co matrix is less than 3 atomic% and 0.2 atomic%, respectively. As more Ta and B are added to the matrix, the continuity (defined as the volume percent discontinuous intermetallic phases divided by the number of free nodes of these phases) of the intermetallic phases in the matrix increase. It was discovered that beyond a certain continuity, it was impossible to roll-deform the as-cast ingots due to the ease of crack propagation along the continuous and brittle intermetallic phase networks. This lead to ingots with a high elemental concentration fracturing during hot-rolling.

Nevertheless, our research demonstrated that if roll deformation can be applied, the resulting microstructure develops a much more refined and homogeneous morphology that greatly enhances the homogeneity of the sputter deposited films. For example, an as-cast product typically has grain and precipitate phase dimensions on the order of 200 microns and 100 microns, respectively. In contrast, cast and wrought product typically have grain and precipitate phase dimensions on the order of 20 microns and 1 micron, respectively.

Figure 1:
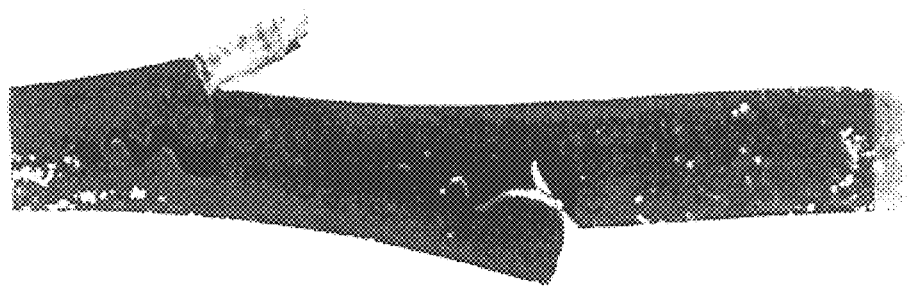
FIG. 1 is an SEM showing the effect of conventional wrought processing attempted on an ingot with more than the critical amount of limited solid-solubility elemental additives.

One approximation to determine how much brittle precipitate phase will form in a Co-base alloy, is to consider the sum of the individual elemental additions to Co normalized by their respective maximum solid-solubilities in Co. Analysis of a range of different Co-base alloys demonstrated that, when (1) for Co based alloys with Cr content <25 atomic and the sum of solid solubility normalized elemental additions to Co is greater than about 2, or (2) for Co based alloys with Cr content >30 atomic% and the sum of solid solubility normalized elemental additions to Co is greater than about 1, the alloy is not fabricable using standard wrought processing and targets have to be manufactured using an as-cast technique (FIG. 1 is an illustration of what happens when wrought processing is attempted on ingots with more than the critical amount of limited solid-solubility elemental additives). The table below illustrates this fact for the case the maximum solid solubilities of Cr, Pt, Ta and B are approximately 40, 100, 4 and 0.2 atomic%, respectively.

| Alloy | Cr (at %) | Sum of Normalized Solid Solubilities | Std. Wrought Processing |
|---|---|---|---|
| Co-12Cr-8Ta | <25 | 2.3 | No |
| Co-16Cr-10Pt-6B-4Ta | <25 | 31.4 | No |
| Co-10Cr-4Ta | <25 | 1.3 | Yes |
| Co-19Cr-3Pt-4Ta | <25 | 1.5 | Yes |
| Co-40Cr-10Ru | >25 | 1.6 | No |
| Co-35Cr-6Ti | >25 | 1.3 | No |
| Co-45Cr | >25 | 1.1 | No |
| Co37Cr | >25 | 0.9 | Yes |

It is noteworthy that when the sum of solid solubility normalized elemental additions to Co, is less than critical values stated in the preceding paragraphs, the invention described herein can still be applied to achieve more aggressive wrought processing (to promote greater microstructural homogeneity) than achievable through conventional processing.

In brief, rolling of cast ingots is an essential process step for producing microstructurally homogeneous, fully dense and low permeability targets for magnetron sputtering applications. Unfortunately, until now, the use of as-cast targets has been the only process option for several brittle Co-base alloys used in the data-storage industry.

In accordance with the present invention, microstructural evaluation after annealing of the brittle ingots revealed that, in addition to partial healing of internal porosity, the process can promote a static recrystallization of the microstructure. It was also shown that the as-cast grain-size can be reduced from several hundred microns after casting to less than 100 microns with the application of the annealing treatment described above. In further experimentation carried out on pieces of annealed cast ingots, it was shown that success in wrought processing brittle ingots subject to a post casting annealing treatment was possible. Specifically, a plate that was machined to process a low thickness to width ratio was particularly forgiving to roll processing. Based on these results, further investigation revealed that brittle Co-base alloys that to this point could not be rolled, can be wrought processed under the following conditions.

1. An ingot is annealed after casting with or without the presence of an applied pressure or compressive stress. In its simplest and most practical form, this annealing can be facilitated by slow cooling the ingot after casting (cooling rate less than or equal to air cooling).
2. The ingot is cast or machined to have a thickness-to-width ratio less than approximately 0.5. Therefore, if an ingot is 7" wide, then the thickness prior to wrought deformation should be less than about 3.5".

In order to obtain an optimum microstructure for sputtering, the annealed ingot with a thickness-to-width aspect ratio less than approx. 0.5, should be rolled at temperatures between 1000° F. to 2500° F., to promote maximum densification and a fine grained dynamically-recrystallized microstructure mechanically. homogenized (via shear deformation) to ensure a fine homogeneous distribution of the precipitate phase(s).

More specifically, a first aspect of the invention resides in a method of producing an alloy member from which sputtering targets can be formed, comprising the steps of: annealing an ingot of an alloy at 1500° F. to 2500° F. for a predetermined time; adjusting the ingot to possess a thickness-to-width aspect ratio of less than 0.5; and rolling the ingot between 1000° F. to 2500° F. to produce the member in the form of a rolled plate.

In accordance with this aspect the predetermined time is in a range of 0.5–168 hours. Further, the method can optionally include one or more the of the steps of: annealing the rolled plate at a temperature of between 500° F. and 2000° F.; annealing the rolled plate at a temperature of between 500° F. and 2000° F. and introducing subsequent rolling steps at temperatures below 1500° F. These additional steps are expressly added to further aid in promoting microstructural homogeneity via recrystallization and shear deformation processes. Further in accordance with this aspect of the invention, the method is such that the alloy contains cobalt and elemental additions, the sum of the solid solubility of normalized elemental additions being greater than a predetermined number, which is greater than 1, or alternatively in the range of 1–50. As previously mentioned, in cases when the sum of solid solubility normalized elemental additions to Co, is less than 1, the invention described herein can still be applied to achieve more aggressive wrought processing (to promote greater microstructural homogeneity) than achievable through conventional processing.

As will be clearly appreciated, the present invention is based on a novel fabrication technique for brittle Co-base alloys which can promote specific product microstructural and magnetic properties which are optimum for magnetron sputtering. The process according to the present invention, is applicable to brittle Co-base alloys where the sum of solid solubility normalized elemental additions to Co exceeds between about 1. The elemental additions are, but not limited to, Cr, Pt, Ni, Ta, B, Nb, Ru, Rh, Sm, Fe, Si, Zr, W, Mo, C, O, V, Hf, and Ti. The process according to the present invention is applicable to all classes of brittle alloys, not just Co-based types.

More specifically, the process which characterizes the present invention features the steps of:

casting an ingot;

annealing the ingot at a temperature of between 1500° F. to 2500° F. (for 0.5 to 168 hours), with or without the presence of an applied hydrostatic or compressive pressure (typical pressures of 2 to 60 ksi can be used);

adjusting the ingot to possess a thickness-to-width aspect ratio of less than 0.5; and rolling the ingot at an initial temperature of between 1000° F. to 2500° F. and reheating the ingot if the temperature falls below 500° F.

In accordance with the present invention, further features include the options of annealing the rolled plates at temperatures between 500° F. and 2000° F.; or annealing the plates at temperatures between room temperature and 1500° F.; annealing the rolled plate at a temperature of between 500° F. and 2000° F. and introducing subsequent rolling steps at temperatures below 1500° F.; or effecting a final annealing at temperatures between 500° F. and 1500° F.

The properties which are produced in accordance with the process according to the present invention are:

Average product grain-size of less than 100 microns.

Average product precipitate dimension of less than 50 microns.

No significant through thickness grain-size and precipitate size gradients.

Theoretical densification attained.

Product PTF greater than 20%.

PTF of a magnetic target is defined as the ratio of transmitted magnetic field to applied magnetic field. A PTF value of 100% is indicative of a non-magnetic material where none of the applied field is shunted through the bulk of the target.

PTF of magnetic target materials is typically specified in the range of 0 to 100%, with the majority of commercially produced materials exhibiting values between 10 to 95%. There are several different techniques that are commonly utilized to measure product PTF. One of the most prevalent techniques utilized involves placing a 4.4 (+/−0.4) kilogauss bar magnet in contact on one side of the target material and monitoring the transmitted field using a axial Hall probe in contact on the other side of the target material. The maximum value of the magnetic field transmitted field through the bulk of the target divided by the applied field strength in the absence of the target between the magnet and probe (maintained at the same distance apart as when the target was between them) is defined as the pass through flux (PTF). PTF can be expressed as either a fraction or a percent. It is well established in the prior art that increasing target material PTF promotes a less severe erosion profile which enhances target material utilization and subsequently contributes to a reduction in cost from the users viewpoint. The presence of severe target erosion profiles also promotes a point source sputtering phenomena which can result in less than optimum deposited film thickness uniformity. Therefore, increasing target material PTF has the added benefit of increasing deposited film thickness uniformity The following examples are presented to illustrate the invention but the invention is not to be considered as limited thereto.

EXAMPLE 1

An alloy containing Co—18Cr—6Pt—6B was heated via induction under a vacuum of between 10 to 40 milliTorr until molten and cast to form an ingot with a thickness-to-width aspect ratio between 0.3 to 0.5. The temperature of the ingot was allowed to reduce in a controlled fashion for a period of 2 hours until a temperature of 1500° F. was reached. The ingot was subsequently annealed between 2000° F. to 2500° F. for 10 hours and hot-rolled in that range for a total reduction of 80%. After rolling the ingot was given a second-stage anneal between 1000° F. to 1800° F. for 3 hours and rolled in that range for a further 20% reduction.

Figure 2:
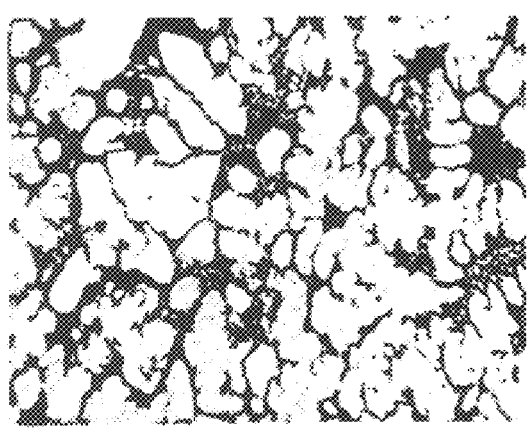
FIG. 2 is an SEM of a Co—18Cr—6Pt—6B alloy as-cast target microstructure.
Figure 3A:
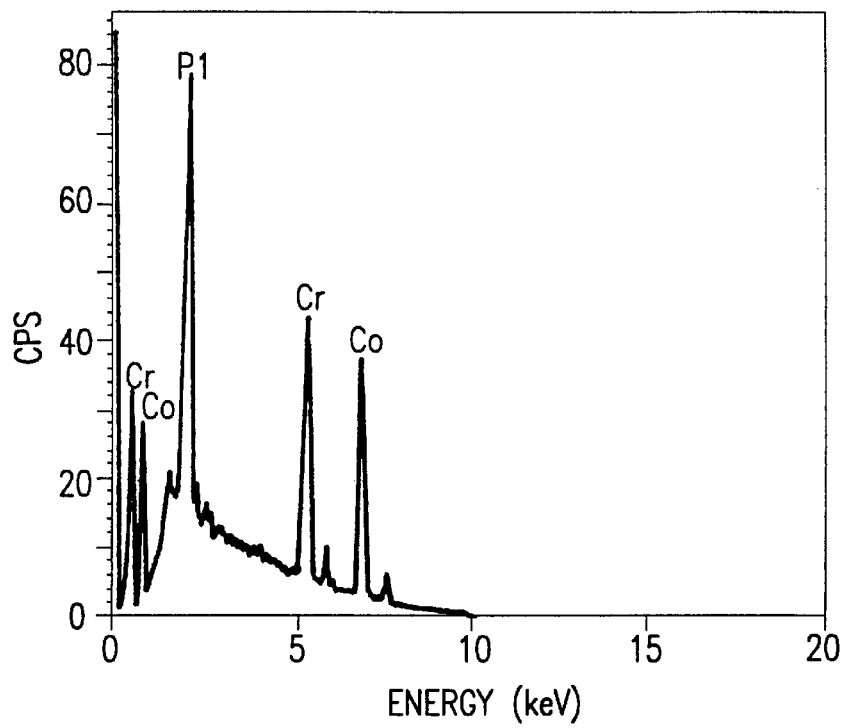
FIG. 3 is an EDS spectra of Co—18Cr—6Pt—6B: (a) matrix phase and (b) precipitate phase.
Figure 3B:
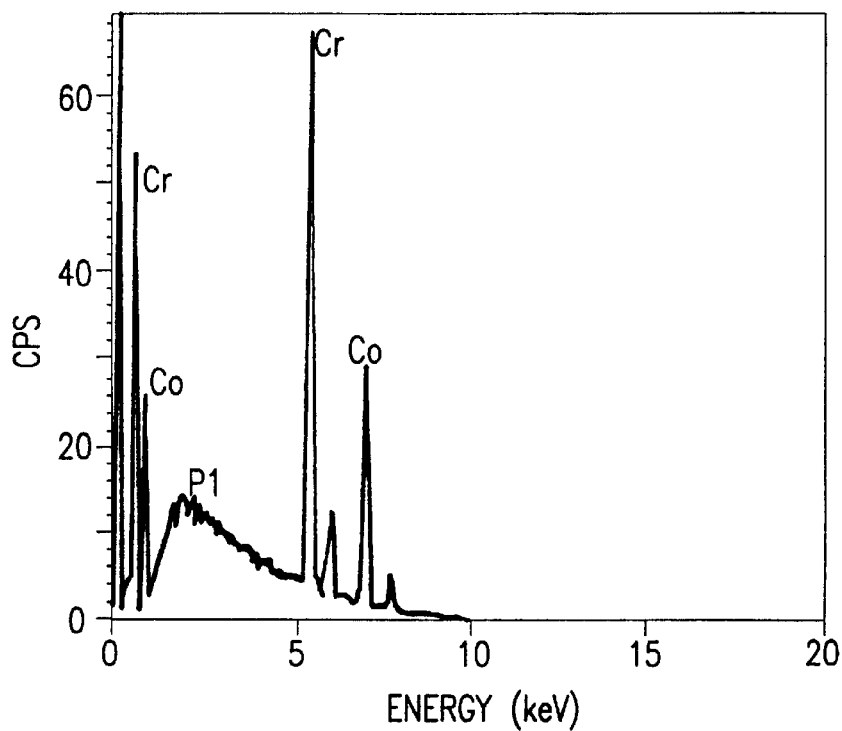

FIG. 2 is an Scanning Electron Microscope (SEM) micrograph using Back Scattered Electron Imaging (BEI) depicting the microstructure of the ingot and resultant as-cast targets manufactured using conventional paradigms. EDS (FIG. 3) and Auger analysis confirm that the matrix phase (light appearing phase) is composed of Co, Cr and Pt and that the precipitate phase (dark appearing phase) has the approximate composition $Co_3Cr_2B$. The average grain-size and precipitate thickness determined using standard ASTM metallographic techniques outlined in "*Quantitative Metallography*" *by E. E. Underwood, ASM Handbook. Vol.* 9, are 140 and 90 micrometers, respectively. The PTF of the as-cast product ranges is nominally about 15% This value is low and represents a sub-optimum situation as far as target utilization during sputtering is concerned.

Figure 4:
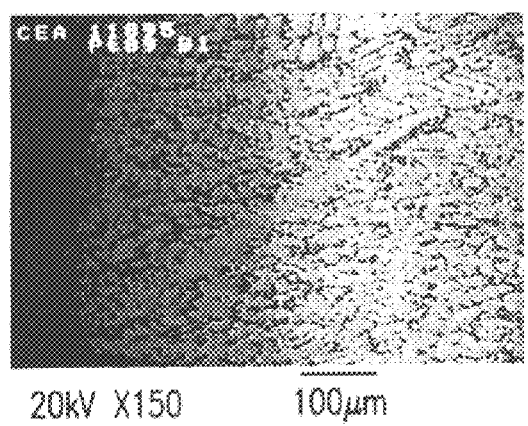
FIG. 4 is an SEM-BET micrograph of a Co—18Cr—6Pt—6B wrought-processed target microstructure using the process of the invention.
Figure 5A:
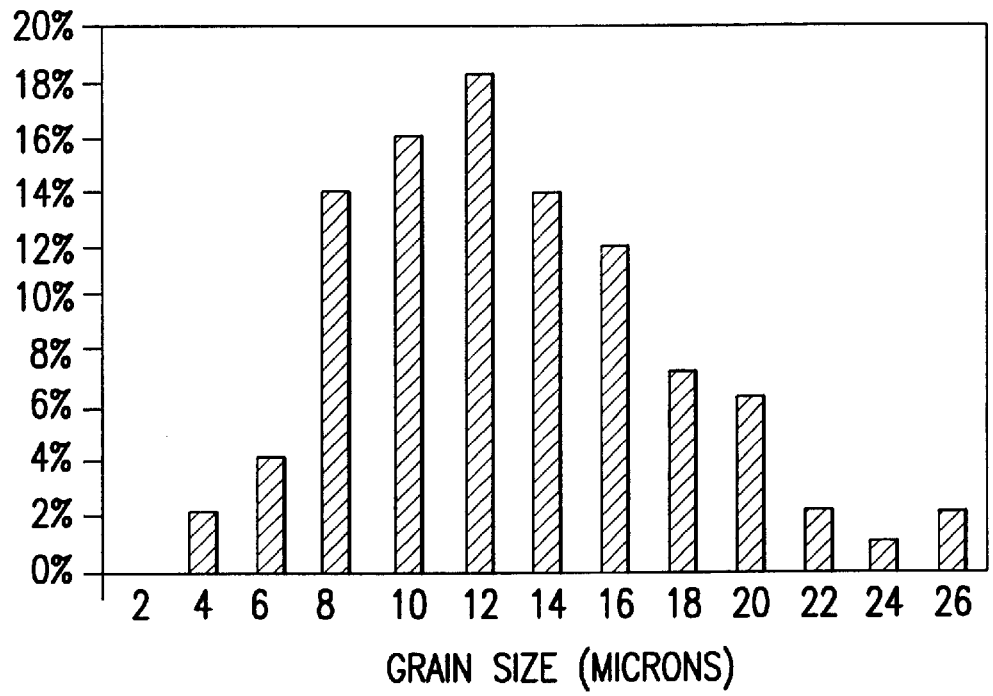
FIG. 5 shows the surface (a) and center (b) grain-size distributions for wrought processed Co—18Cr—6Pt—6B.
Figure 5B:
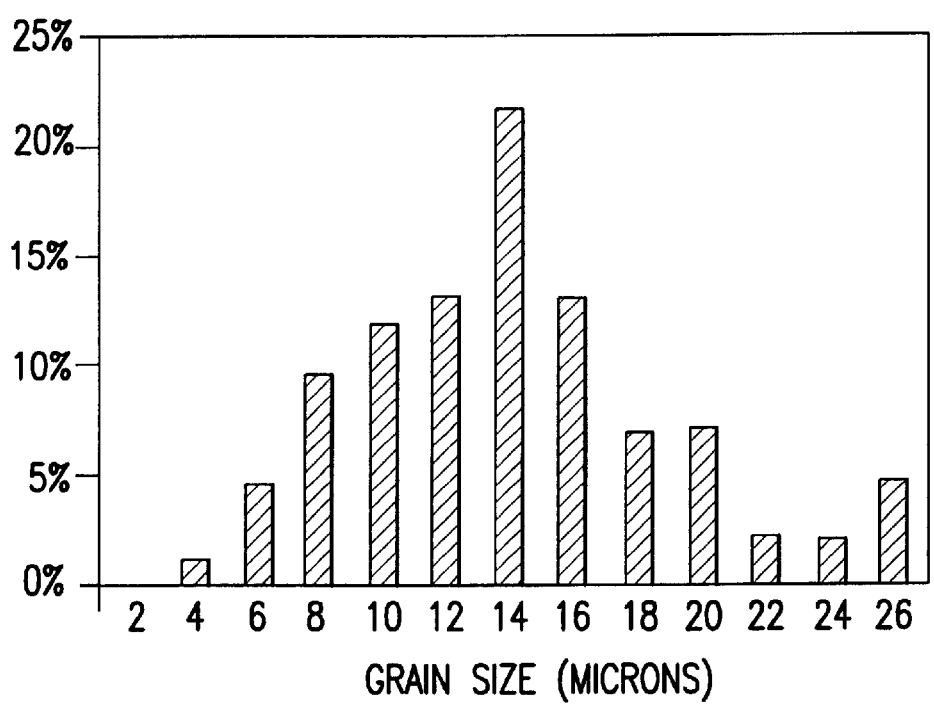

In contrast, FIG. 4 is an SEM-BEI micrograph illustrating the microstructural benefits of applying the novel process described herein to the Co—18Cr—6Pt—6B alloy. The phase compositions are similar to those determined in the as-cast state, but the morphology is very different as a result of the wrought processing employed. The average grain-size and precipitate are 13 and 1 micrometers, respectively. The microstructure is very uniform, and this uniformity persists through the thickness of the target product. FIG. 5 depicts the surface and center grain-size distributions illustrating that no statistically significant difference exists through the thickness of the product. As mentioned in the Background, A fine-grain/fine-precipitate microstructure and through thickness uniformity is critical to ensure consistent target performance since 1 target pair can typically be utilized to manufacture in excess of 20,000 storage media disks.

Figure 6:
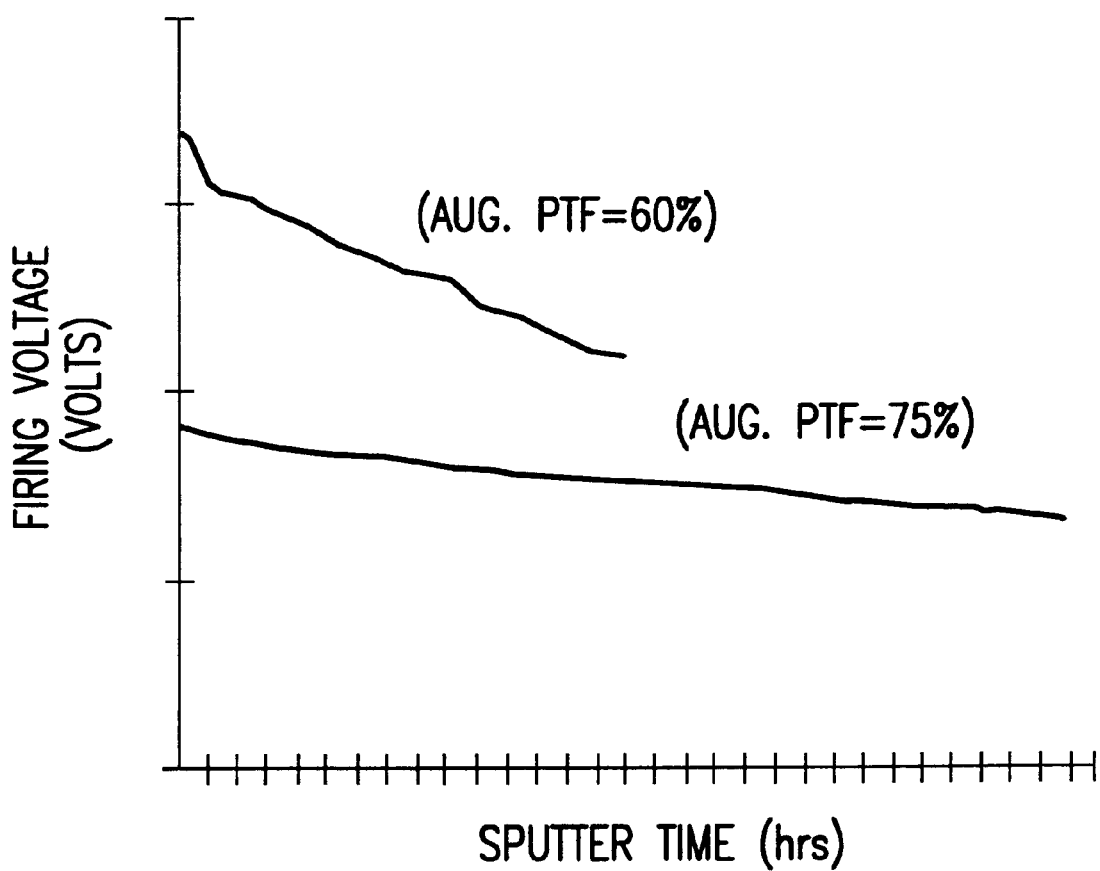
FIG. 6 shows the effect of target PTF on sputter process voltage stability and target lifetime.

Furthermore, application of the proprietary wrought process described in the present patent raises the product PTF from 15% as-cast to approximately 75%. This more than four-fold improvement in product PTF has a significant impact in rendering the sputter process more stable and extending the useful life of the target product. To illustrate the impact of high PTF, FIG. 6 demonstrates the positive effect of raising nominal target PTF from 65% to 75% on improving sputter process firing voltage stability and target life time. Clearly, increasing PTF from 15% to 75% will have a profound effect on sputter process stability and target yield.

In summary, application of the new proprietary wrought process to Co—18Cr—6Pt—6B yielded significant microstructural uniformity and PTF improvements over conventionally fabricated as-cast product. The following examples will serve to establish the generality of the novel paradigms developed in the present patent.

EXAMPLE 2

An alloy containing Co—15Cr—4Pt—5Ta—2B was heated via induction under a vacuum of between 10 to 40 milliTorr until molten and cast to form an ingot with a thickness-to-width aspect ratio between 0.1 to 0.3. The temperature of the ingot was allowed to reduce in a controlled fashion for a period of 1 hours until a temperature of 1000° F. was reached. The ingot was subsequently annealed between 2000° F. to 2500° F. for 10 hours and hot-rolled between 1200° F. to 2100° F. for a total reduction of 50% and allowed to cool in a controlled fashion from the rolling, temperature to 300° F. in 6 hours.

Figure 7:
FIG. 7 is an SEM micrograph of the microstructure of Co—15Cr—4Pt—5Ta—2B as-cast target microstructure.
Figure 8A:
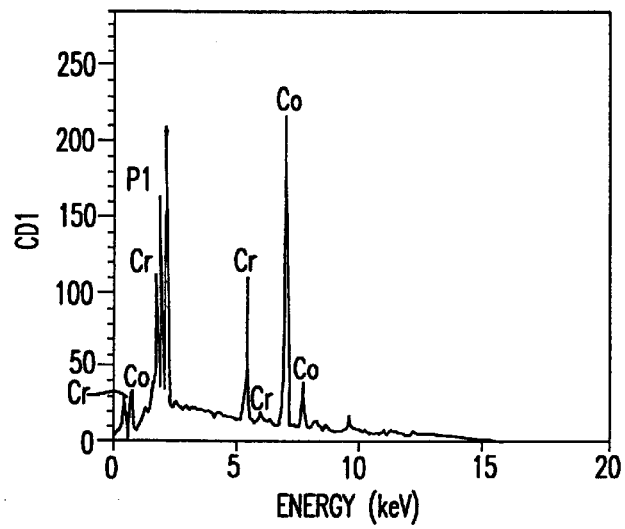
FIG. 8 is an Auger analysis which shows (a) the matrix phase, (b) the first precipitate phase and (c) the second precipitate phase of the microstructure of FIG. 7.
Figure 8B:
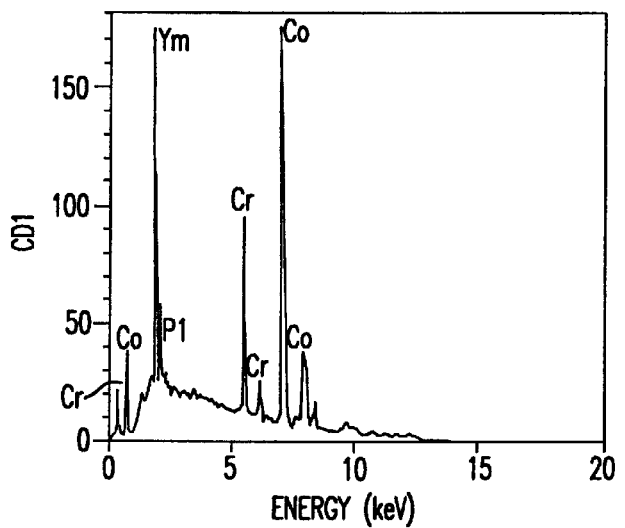
Figure 8C:
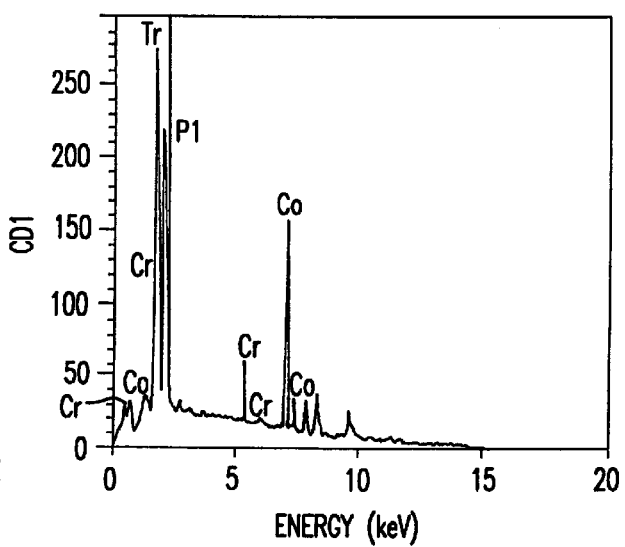

FIG. 7 is a Scanning Electron Microscope (SEM) micrograph using Back Scattered Electron Imaging (BEI) depicting the microstructure of the ingot and resultant as-cast targets manufactured using conventional paradigms. EDS (FIG. 8) and Auger analysis confirm that the matrix phase (gray appearing phase) is composed of Co, Cr, Pt and Ta, that the first precipitate phase (light appearing phase) is composed of Co, Pt and Ta and the second precipitate phase (dark appearing phase) is composed of Co, Cr, Ta and B. The average grain-size and precipitate diameter are 180 and 85 micrometers, respectively. The PTF of the as-cast product ranges is nominally about 10%. This value is even lower than that obtained in the case of as-cast Co—18Cr—6Pt—6B.

Figure 9:
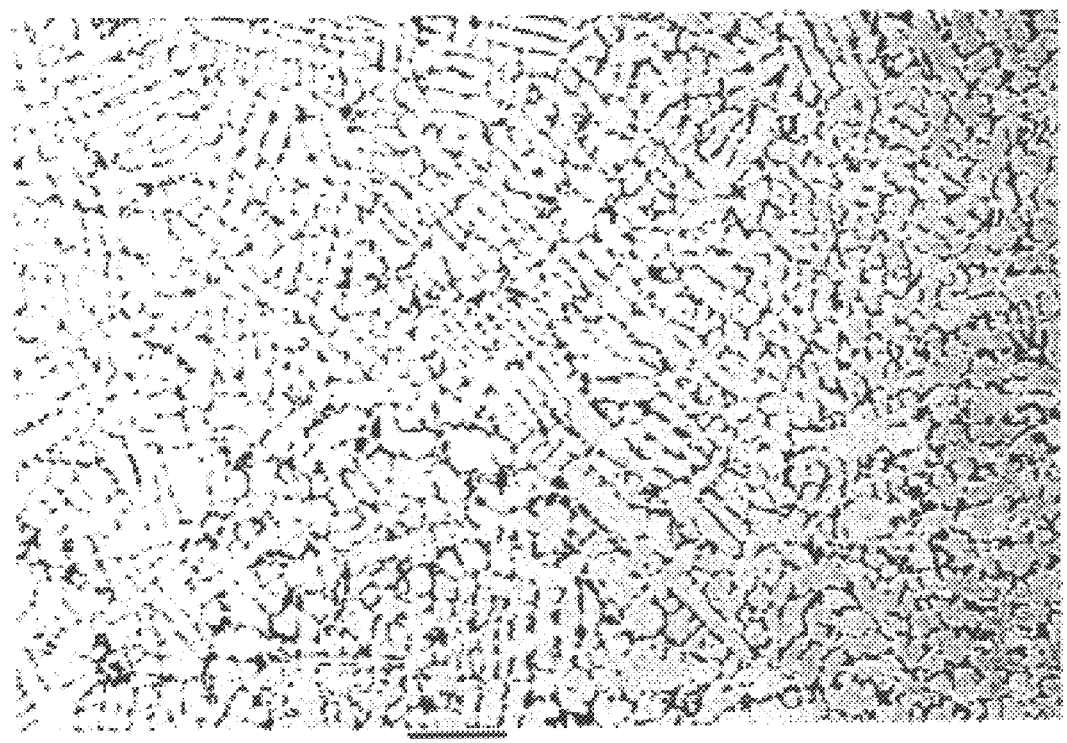
FIG. 9 is an SEM-BEI micrograph showing Co—15Cr—4Pt—5Ta—2B wrought-processed target microstructure using the invention.
Figure 10A:
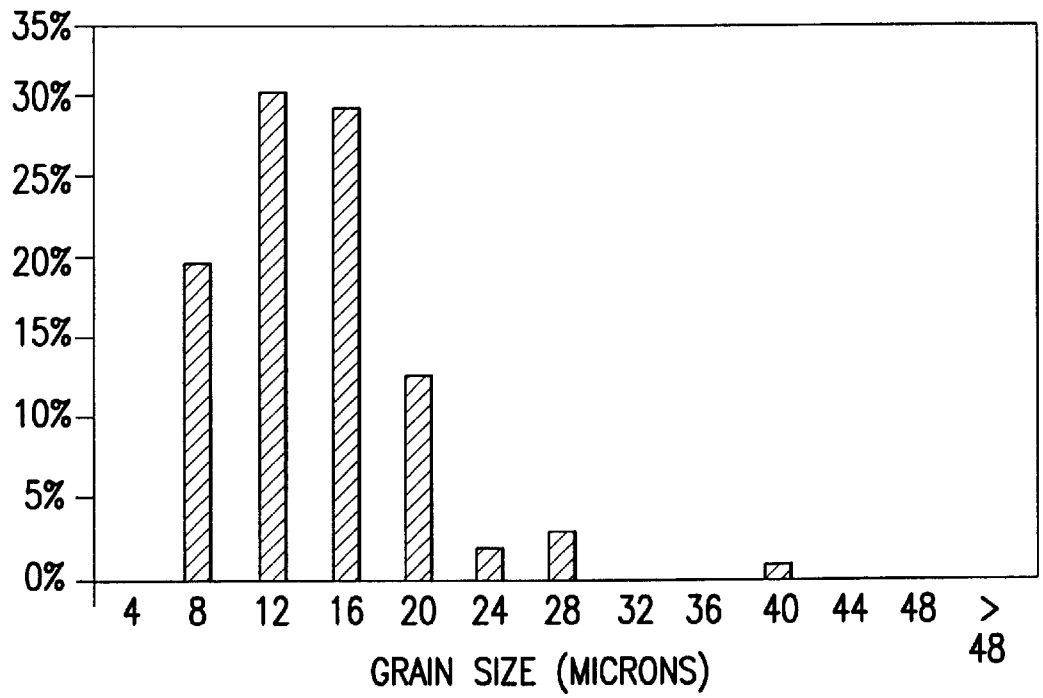
FIG. 10 shows the surface (a) and center (b) grain-size distributions for wrought processed Co—15Cr—4Pt—5Ta—2B.
Figure 10B:
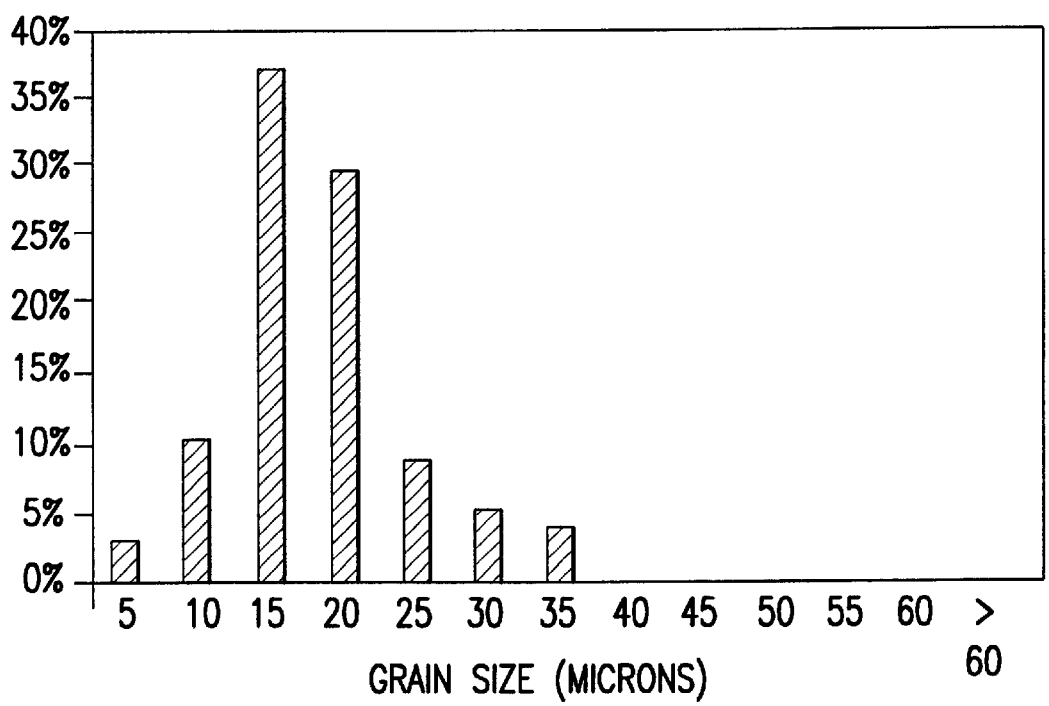

In contrast, FIG. 9 is an SEM-BEI micrograph illustrating the uniform microstructure obtained by applying the novel process described herein to the Co—15Cr—4Pt—5Ta—2B alloy. The phase compositions are similar to those determined in the as-cast state, but the morphology is very different as a result of the wrought processing employed. The average grain-size and precipitate dimension are 14 and 1 micrometers, respectively. The microstructure is very uniform, and this uniformity persists through the thickness of the target product. FIG. 10 depicts the surface and center grain-size distributions illustrating that no statistically significant difference exists through the thickness of the product.

As in the previous example, application of the proprietary wrought process described in the present patent raises the product PTF from 10% as-cast to approximately 90%. This represents a very significant nine-fold improvement in product PTF. Once again, it is clear that application of the proprietary wrought process described herein to complex, brittle and multi-phasic alloys can have a significant positive impact on microstructural homogeneity and macromagnetic (PTF) properties.

EXAMPLE 3

Two alloys, Co—18Cr—6Pt—9B and Co—12Cr—8Ta were heated via induction under a vacuum of between 10 to 40 milliTorr until molten and cast to form ingots with thickness-to-width aspect ratios of 0.4, 0.25 and 0.07, respectively. The temperature of the ingots were allowed to reduce in a controlled fashion for a period of 1.5 hours until a temperature of 1000° F. was reached. All the ingots was subsequently annealed between 2000° F. to 2500° F. for between 6 to 15 hours and hot-rolled between 1800° F. to 2500° F. for a total reduction of 50% and allowed to cool in a controlled fashion from the rolling temperature to 200° F. in 2 hours.

Figure 11A:
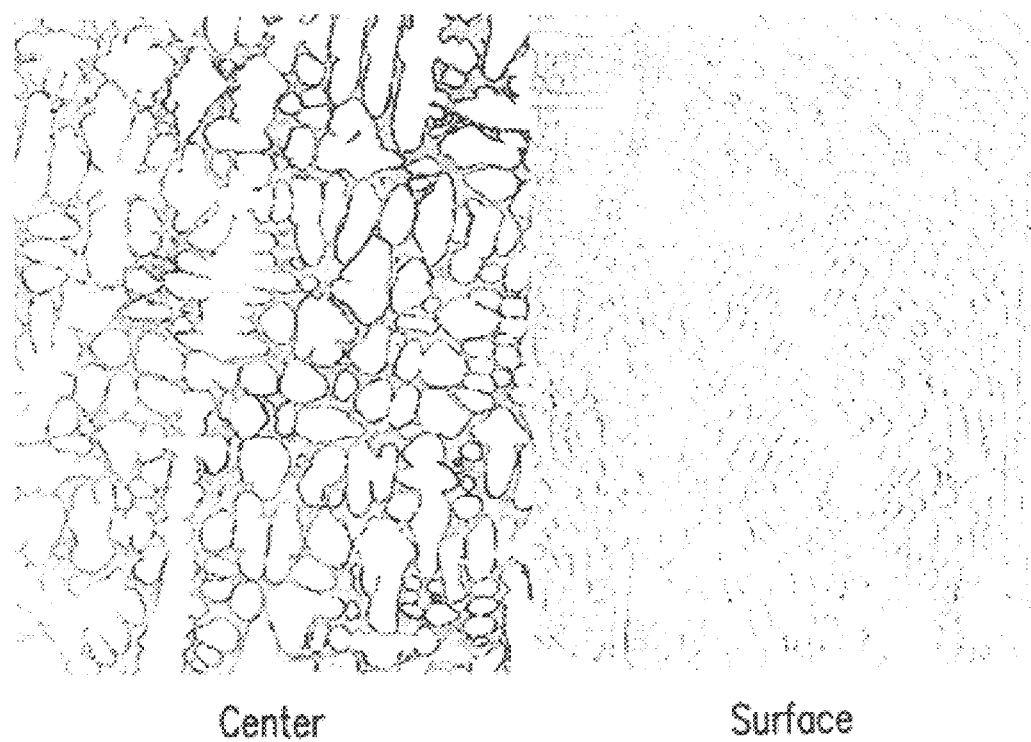
FIG. 11 shows SEM micrographs of the center and surface of as-cast target microstructures of (a) Co—18Cr—6Pt—9B, (b) Co—12Cr—8Ta.
Figure 11B:
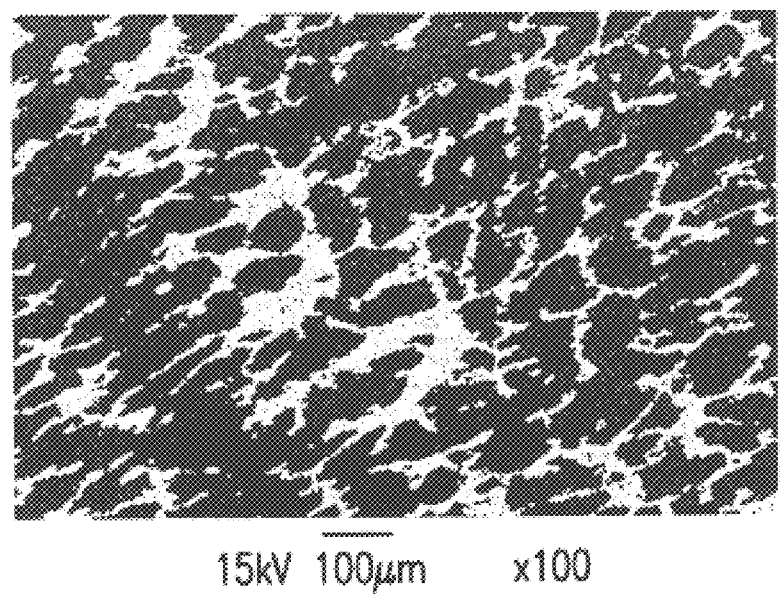

FIG. 11 illustrates Scanning Electron Microscope (SEM) micrographs using Back Scattered Electron Imaging (BEI) depicting the microstructure of the ingots and resultant as-cast targets manufactured using conventional paradigms. SEM-EDS and Auger analysis confirm the following phase compositions for the different alloys:

| | | |
|---|---|---|
| Co-18Cr-6Pt-9B: | matrix phase (light) | Co-Cr-Pt |
| | Precipitate phase (dark) | Co-Cr-B |
| Co-12Cr-8Ta | matrix phase (dark) | Co-Cr-Ta |
| | Precipitate phase (light) | Co-Ta |

The average as-cast grain-size, precipitate diameters and PTF are

| Co-18Cr-6Pt-9B: | 130 and 135 micrometers and 8% |
| Co-12Cr-8Ta | 185 and 170 micrometers and 25% |

Figure 12A:
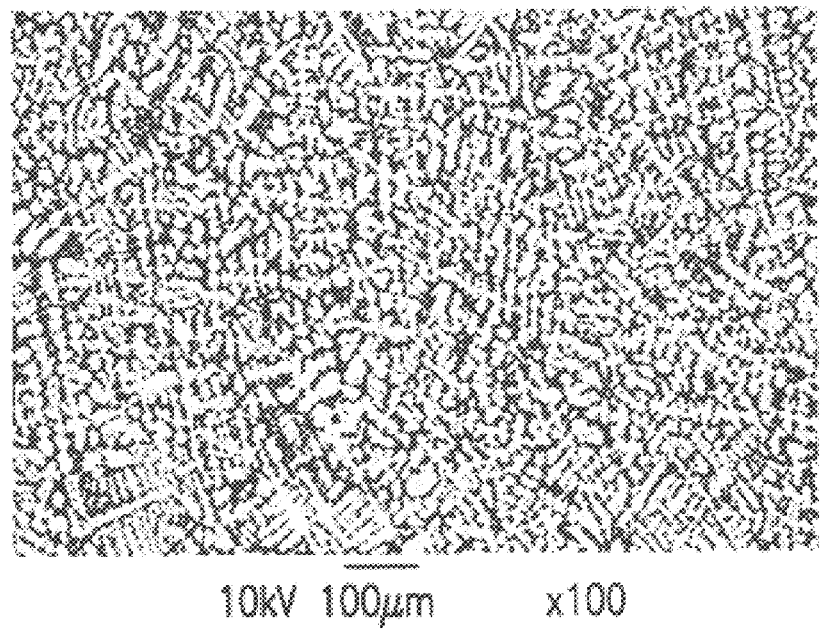
FIG. 12 is an SEM-BEI micrograph of wrought-processed target microstructures using the invention for: (a) Co—18Cr—6Pt—9B, (b) Co—12Cr—8Ta.
Figure 12B:
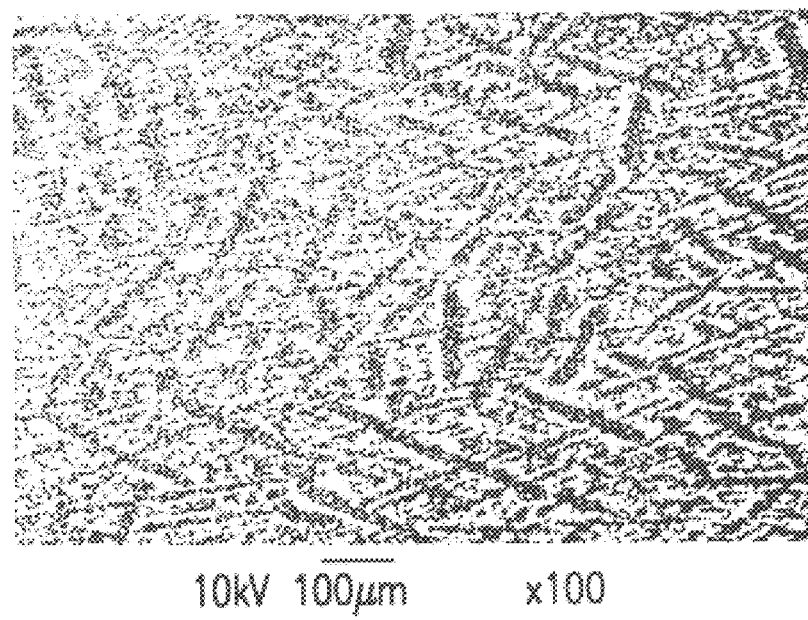

In contrast, FIG. 12 is an SEM-BEI micrograph illustrating the uniform microstructure obtained by applying the novel process described herein. The phase compositions are similar to those determined in the as-cast conventional state, but the morphology is very different as a result of the wrought processing employed. The average grain-size and precipitate diameters after application of the novel processing described herein are:

| Co-18Cr-6Pt-9B: | 9 and 1 micrometers |
| Co-12Cr-8Ta | 35 and 40 micrometers |

As in the previous examples, the microstructure is very uniform, and this uniformity persists through the thickness of the target product for all three of the alloys listed above.

Application of the proprietary wrought process described in the present patent raises Co—18Cr6Pt—9B and Co—12Cr—8Ta product PTF from 8% and 25%, respectively, as-cast to approximately 80% and 95%, respectively. It is generally understood that in Co-based alloys, if the combined content of Cr, Ta, Nb and W exceed approximately 25 atomic%, then the alloy is paramagnetic at ambient temperatures and the room temperature PTF is 100%. This is the case for alloys such as Co—40Cr—(Ti, Al,Ru). For these types of alloys, the main benefit of the proprietary wrought process described in the present patent is to promote microstructural refinement and homogeneity for more uniform sputter processing and thin film media performance.

It will be appreciated that although the invention has been disclosed with reference to only a limited number of embodiments and examples, that the invention is not so limited and is bound only by the scope of the appended claims.

What is claimed is:

1. A method for producing an alloy member characterized by a substantially microstructurally homogeneous morphology and magnetic properties optimized for forming low permeability sputtering targets therefrom, the alloy member having grain uniformity comprising an average grain size of less than 100 microns, and an average product precipitate dimension of less than 50 microns, the method comprising:
   a) providing an alloy which is sufficiently brittle that the alloy cannot be rolled and wrought processed to form a product having a substantially homogenous morphology;
   b) casting the alloy as an ingot;
   c) annealing the ingot by heating at a temperature of between 1500° F. and 2500° F.;
   d) working the annealed ingot to form an alloy member which has a thickness to width ratio of less than approximately 0.5; and
   e) rolling the alloy member at a temperature of between 1000° F. and 2500° F. to produce the member in the form of a rolled plate and promote densification and fine grain in the alloy member.

2. A method according to claim 1, wherein the annealing step is conducted at atmospheric pressure.

3. A method according to claim 1, wherein the annealing step is conducted at under a pressure of 2 to 60 ksi.

4. A method according to claim 1, wherein after the annealing step, the ingot is cooled at a rate of less than or equal to air cooling.

5. A method according to claim 1, wherein the alloy is a brittle cobalt based alloy wherein elemental additions to the cobalt alloy are in insufficient amounts to produce intermetallic phases which interfere with the homogeneous nature of the alloy.

6. A method according to claim 5, wherein the cobalt based alloy comprises elemental additions of a member selected from the group consisting of Cr, Pt, Ni, Ta, B, Nb, Ru, Rh, Sm, Fe, Si, Zr, W, Mo, C, O, V, Hf, Ti and mixtures thereof.

7. A method according to claim 5, wherein the brittle alloy is a Co—Cr—Pt—B—Ta alloy.

8. A method according to claim 6, wherein the brittle alloy is selected from the group consisting of:
   Co—12Cr—8 Ta
   Co—18Cr—6Pt—6B
   Co—15Cr—4Pt—5Ta—2bf
   Co—16Cr—10Pt—6B—4Ta
   Co—10Cr—4Ta
   Co—19Cr—3Pt—4Ta
   Co—40Cr—10Ru
   Co—35Cr—6Ti
   Co—45Cr
   Co—37Cr all amounts expressed in atomic %.

9. A method as set forth in claim 1, wherein annealing is carried out for a time period of about 0.5–168 hours.

10. A method as set forth in claim 1, comprising the further step of (f) of annealing the rolled plate at a temperature of between 500° F. and 2000° F.

11. A method as set forth in claim 1, comprising the further step of: annealing the rolled plate between room temperature and a temperature of 1500° F.

12. A method as set forth in claim 1, comprising the further steps of: cutting a sputtering target from the rolled plate; and annealing the target at a temperature of between 500° F. and 1500° F.

13. A method as set forth in claim 1, comprising the further steps of: cutting a sputtering target out of the rolled plate; and annealing the target at a temperature of 500° F. and 1500° F. and subsequently rolling the annealed target at temperatures below 1500° F.

14. A method as set forth in claim 1, wherein the alloy contains cobalt and elemental additions, the sum of the solid solubility of normalized elemental additions being greater than one.

15. A method as set forth in claim 13, wherein the annealing is for greater than about 1 hour.

16. A method as set forth in claim 13, wherein the annealing time is within the range of 10–40 hours.

17. A method as set forth in claim 1, wherein the alloy is Co—18Cr—6Pt—6B expressed in atomic %.

18. A method as set forth in claim 1, wherein the alloy is Co—15Cr—4Pt—5Ta—2B expressed in atomic %.

19. A method as set forth in claim 1, wherein the alloy is Co—18Cr—6Pt—9B expressed in atomic %.

20. A method as set forth in claim 1, wherein the alloy is Co—12Cr—8Ta expressed in atomic %.

* * * * *